United States Patent
Doi et al.

(10) Patent No.: US 11,814,547 B2
(45) Date of Patent: Nov. 14, 2023

(54) POLISHING LIQUID COMPOSITION FOR SILICON OXIDE FILM

(71) Applicant: KAO CORPORATION, Tokyo (JP)

(72) Inventors: Haruhiko Doi, Wakayama (JP);
Norihito Yamaguchi, Wakayama (JP);
Masato Sugahara, Wakayama (JP);
Takanao Seike, Wakayama (JP);
Masaki Inoue, Wakayama (JP)

(73) Assignee: KAO CORPORATION, Tokyo (JP)

( * ) Notice: Subject to any disclaimer, the term of this patent is extended or adjusted under 35 U.S.C. 154(b) by 0 days.

(21) Appl. No.: 17/280,427

(22) PCT Filed: Sep. 18, 2019

(86) PCT No.: PCT/JP2019/036554
§ 371 (c)(1),
(2) Date: Mar. 26, 2021

(87) PCT Pub. No.: WO2020/066786
PCT Pub. Date: Apr. 2, 2020

(65) Prior Publication Data
US 2022/0002588 A1    Jan. 6, 2022

(30) Foreign Application Priority Data

Sep. 28, 2018 (JP) ................. 2018-184736
Sep. 28, 2018 (JP) ................. 2018-184741
Nov. 16, 2018 (JP) ................. 2018-215753
Jul. 9, 2019 (JP) ................. 2019-127786

(51) Int. Cl.
*C09G 1/02* (2006.01)
*H01L 21/3105* (2006.01)

(52) U.S. Cl.
CPC .......... *C09G 1/02* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 2006/0094882 A1* | 5/2006 | Umemoto | C07C 291/02 548/335.1 |
| 2007/0219104 A1* | 9/2007 | Grumbine | C09K 3/1463 134/42 |
| 2010/0072417 A1 | 3/2010 | Criniere | |
| 2010/0200802 A1* | 8/2010 | Grumbine | H01L 21/3212 252/79.1 |
| 2014/0094032 A1 | 4/2014 | Yoshida et al. | |
| 2016/0257856 A1 | 9/2016 | Reiss et al. | |
| 2018/0016469 A1* | 1/2018 | Kraft | H01L 21/3212 |
| 2018/0244956 A1* | 8/2018 | Hains | H01L 21/31053 |
| 2020/0017717 A1 | 1/2020 | Yoshino et al. | |

FOREIGN PATENT DOCUMENTS

| | | |
|---|---|---|
| CN | 107427988 A | 12/2007 |
| CN | 103503118 A | 1/2014 |
| JP | 9-137155 A | 5/1997 |
| JP | 2007-311779 A | 11/2007 |
| JP | 2010-505735 A | 2/2010 |
| JP | 2013-32502 A | 2/2013 |
| JP | 2013119131 A | 6/2013 |
| JP | 2015-63451 A | 4/2015 |
| JP | 2015-195391 A | 11/2015 |
| JP | 2016-30778 A | 3/2016 |
| JP | 2016-122487 A | 7/2016 |
| JP | 2018-512475 A | 5/2018 |
| JP | 2018-109089 A | 7/2018 |
| WO | WO 2007/108925 A2 | 9/2007 |

OTHER PUBLICATIONS

International Search Report, issued in PCT/JP2019/036554, PCT/ISA/210, dated Dec. 17, 2019.
Indian Office Action for Indian Application No. 202117017179 dated Sep. 22, 2022, with English translation.

* cited by examiner

*Primary Examiner* — Shamim Ahmed
(74) *Attorney, Agent, or Firm* — Birch, Stewart, Kolasch & Birch, LLP

(57) ABSTRACT

Provided is a polishing liquid composition that is able to improve the polishing rate of a silicon oxide film in one aspect. An aspect of the present disclosure relates to a polishing liquid composition for a silicon oxide film. The polishing liquid composition contains cerium oxide particles (component A), an additive (component B), and an aqueous medium. The component B is a compound having a reduction potential of 0.45 V or more when a 10 ppm aqueous solution of the component B is measured by cyclic voltammetry (with an Ag/AgCl electrode as a reference).

16 Claims, No Drawings

POLISHING LIQUID COMPOSITION FOR SILICON OXIDE FILM

TECHNICAL FIELD

The present disclosure relates to a polishing liquid composition that contains cerium oxide particles and is used for a silicon oxide film, a method for producing a semiconductor substrate by using the polishing liquid composition, and a method for polishing a substrate with the polishing liquid composition.

BACKGROUND ART

Chemical mechanical polishing (CMP) is a planarization technique in which a working surface of a substrate to be polished is brought into contact with a polishing pad, and the substrate and the polishing pad are moved relative to each other while a polishing liquid is being supplied to the contact area between them, so that the uneven portion of the surface of the substrate undergoes a chemical reaction and is removed mechanically.

At present, the CMP technique is essential for, e.g., the planarization of an interlayer insulation film, the formation of a shallow trench element isolation structure (also referred to as an "element isolation structure" in the following), or the formation of a plug and embedded metal wiring in the manufacturing process of semiconductor devices. In recent years, rapid progress has been made in multilayer semiconductor devices with high definition, and further improvements in yield and throughput of semiconductor devices have been increasingly required. Accordingly, there has also been a demand for high speed polishing without any polishing scratches in the CMP process. For example, in the process of forming the shallow trench element isolation structure, it is desirable that not only the polishing rate, but also the polishing selectivity of a polishing stopper film (e.g., silicon nitride film) with respect to a film to be polished (e.g., silicon oxide film) be improved (in other words, the polishing selectivity means that the polishing stopper film is less likely to be polished than the film to be polished).

For example, JP 2018-512475 A (Patent Document 1) proposes a polishing liquid composition for CMP that contains wet-process ceria particles, a functionalized heterocycle, a pH-adjusting agent, and an aqueous carrier, and that has a pH of about 1 to 6. Patent Document 1 teaches that the polishing liquid composition may contain an additive such as a picolinic acid N-oxide (see paragraph [0064] and Example 5 of Patent Document 1).

JP 2015-195391 A (Patent Document 2) proposes a polishing liquid composition for CMP that contains an amino compound, a radical-forming oxidizing agent, a radical trapping agent, and an aqueous carrier. Examples of the radical trapping agent include hydroxyl-substituted heterocyclic aromatic compounds such as 2-hydroxypyridine and N-oxide compounds such as 1-(2-hydroxymethyl) piperazine-N-oxide (see, e.g., claim 2 and paragraphs [0032], [0034] of Patent Document 2).

On the other hand, the use of a polishing liquid composition that contains a compound having a quinoline structure in a polishing process of a glass hard disk substrate has been proposed (see, e.g., JP 2016-122487 A (Patent Document 3)).

DISCLOSURE OF INVENTION

An aspect of the present disclosure relates to a polishing liquid composition for a silicon oxide film. The polishing liquid composition contains cerium oxide particles (component A), arm additive (component B), and an aqueous medium. The component B is a compound having a reduction potential of 0.45 V or more when a 10 ppm aqueous solution of the component B is measured by cyclic voltammetry (with an Ag/AgCl electrode as a reference).

DESCRIPTION OF THE INVENTION

In the field of semiconductor, wiring has been required to be finer and more complicated with the recent progress in high integration. For this reason, the CMP process uses abrasive grains having a smaller particle size in order to reduce defects. However, the use of small abrasive grains may result in a low polishing rate. Thus, it is necessary to improve the polishing rate of a silicon oxide film.

The present disclosure provides a polishing liquid composition for a silicon oxide film that is able to improve the polishing rate of a silicon oxide film, a method for producing a semiconductor substrate by using the polishing liquid composition, and a method for polishing a substrate with the polishing liquid composition.

An aspect of the present disclosure relates to a polishing liquid composition for a silicon oxide film. The polishing liquid composition contains cerium oxide particles (component A), an additive (component B), and an aqueous medium. The component B is a compound having a reduction potential of 0.45 V or more when a 10 ppm aqueous solution of the component B is measured by cyclic voltammetry (with an Ag/AgCl electrode as a reference).

Another aspect of the present disclosure relates to a polishing liquid composition for a silicon oxide film. The polishing liquid composition contains cerium oxide particles (component A), an additive (component B), and an aqueous medium. The component B is at least one selected from (i) an N-oxide compound containing a nitrogen-containing heteroaromatic ring skeleton in which at least one hydrogen atom is substituted with a hydroxyl group, or a salt of the N-oxide compound (component B1), (ii) an N-oxide compound containing a nitrogen-containing heteroaromatic ring skeleton in which at least one hydrogen atom is substituted with a thiol group, or a salt of the N-oxide compound (component B2), or (iii) a compound containing a nitrogen-containing heteroaromatic ring skeleton having at least one hydroxyl group and at least one carbonyl group, or a salt of the compound (component B3).

Another aspect of the present disclosure relates to a method for producing a semiconductor substrate. The method includes polishing a film to be polished with the polishing liquid composition of the present disclosure.

Another aspect of the present disclosure relates to a polishing method that includes polishing a film to be polished with the polishing liquid composition of the present disclosure.

In one aspect, the present disclosure can provide a polishing liquid composition for a silicon oxide film that is able to improve the polishing rate of a silicon oxide film.

In one aspect, the present disclosure is based on the findings that the polishing rate of a silicon oxide film can be improved by incorporating a compound with a reduction potential of 0.45 V or more into a polishing liquid composition that contains cerium oxide (also referred to as "ceria" in the following) particles as abrasive grains.

In one aspect, the present disclosure relates to a polishing liquid composition for a silicon oxide film (also referred to as a "polishing liquid composition of the first aspect" in the following). The polishing liquid composition of the first aspect contains cerium oxide particles (component A), an additive (component B), and an aqueous medium. The component B is a compound having a reduction potential of 0.45 V or more when a 10 ppm aqueous solution of the component B is measured by cyclic voltammetry (with an Ag/AgCl electrode as a reference). The polishing liquid composition of the first aspect is able to improve the polishing rate of a silicon oxide film.

The details of the mechanism of the effect of the first aspect are not fully clear, but can be assumed as follows.

In general, ceria particles are used to polish a silicon oxide film. Cerium in the ceria particles is usually quadrivalent, and in rare cases can be trivalent as a result of losing oxygen (O). Such trivalent cerium in the ceria particles may weaken the Si—O bond of the silicon oxide film, make the silicon oxide film fragile, and thus accelerate polishing.

In the first aspect, the ceria particles are used in combination with the additive (component B) that is a compound having a reduction potential of a predetermined value or more. The component B is considered to reduce the quadrivalent cerium present on the surface of the ceria particles to the trivalent cerium. Thus, the proportion of the trivalent cerium in the ceria particles can be increased. This may promote the action on the Si—O bond of the silicon oxide film so that the silicon oxide film becomes more fragile. Consequently the polishing rate can be improved.

However, the present disclosure should not be interpreted solely by the above mechanism.

In another aspect, the present disclosure is based on the findings that the polishing rate of a silicon oxide film can be improved by incorporating a particular N-oxide compound or a particular nitrogen-containing heteroaromatic ring compound into a polishing liquid composition that contains cerium oxide (ceria) particles as abrasive grains.

In another aspect, the present disclosure relates to a polishing liquid composition for a silicon oxide film (also referred to as a "polishing liquid composition of the second aspect" in the following). The polishing liquid composition of the second aspect contains cerium oxide particles (component A), an additive (component B), and an aqueous medium. The component B is at least one selected from (i) an N-oxide compound containing a nitrogen-containing heteroaromatic ring skeleton in which at least one hydrogen atom is substituted with a hydroxyl group, or a salt of the N-oxide compound (component B1), (ii) an N-oxide compound containing a nitrogen-containing heteroaromatic ring skeleton in which at least one hydrogen atom is substituted with a thiol group, or a salt of the N-oxide compound (component B2), or (iii) a compound containing a nitrogen-containing heteroaromatic ring skeleton having at least one hydroxyl group and at least one carbonyl group, or a salt of the compound (component B3). The polishing liquid composition of the second aspect is able to improve the polishing rate of a silicon oxide film.

The details of the mechanism of the effect of the second aspect are not fully clear, but can be assumed as follows.

In general, ceria particles are used to polish a silicon oxide film. Cerium in the ceria particles is usually quadrivalent, and in rare cases can be trivalent as a result of losing oxygen (O). Such trivalent cerium in the ceria particles may weaken the Si—O bond of the silicon oxide film, make the silicon oxide film fragile, and thus accelerate polishing.

In the second aspect, the ceria particles are used in combination with the particular N-oxide compound or the particular nitrogen-containing heteroaromatic ring compound (component B). The hydroxyl group or thiol group of the component B is considered to reduce the quadrivalent cerium present, on the surface of the ceria particles to the trivalent cerium. Thus, the proportion of the trivalent cerium in the ceria particles can be increased. This may promote the action on the Si—O bond of the silicon oxide film so that the silicon oxide film becomes more fragile. Consequently, the polishing rate can be improved.

However, the present disclosure should not be interpreted solely by the above mechanism.

[Cerium Oxide (Ceria) Particles (Component A)]

The polishing liquid composition of the present disclosure contains ceria particles (also referred to simply as a "component A" in the following) as polishing abrasive grains. The component A may include one type or a combination of two or more types of ceria particles.

The production method, shape, and surface state of the component A are not particularly limited. Examples of the component A include colloidal ceria, irregularly-shaped ceria, and ceria-coated silica.

The colloidal ceria can be obtained by a build-up process, e.g., in the method described in Examples 1 to 4 of JP 2010-505735 A.

The irregularly-shaped ceria may be, e.g., ground ceria. An embodiment of the ground ceria may be, e.g., calcined and ground ceria obtained by calcining and grinding a cerium compound such as cerium carbonate or cerium nitrate. Another embodiment of the ground ceria may be, e.g., single crystal ground ceria obtained by wet-grinding ceria particles in the presence of an inorganic acid or organic acid. The inorganic acid used in the wet-grinding may be, e.g., a nitric acid. The organic acid used in the wet-grinding may be, e.g., an organic acid having a carboxyl group. Specifically, the organic acid may be at least one selected from picolinic acid, glutamic acid, aspartic acid, aminobenzoic acid, or p-hydroxybenzoic acid. The wet-grinding method may be, e.g., wet-grinding with a planetary bead mill or the like.

The ceria-coated silica may be, e.g., composite particles with a structure in which at least a part of the surface of individual silica particles is covered with granular ceria by the method described in Examples 1 to 14 of JP 2015-63451 A or Examples 1 to 4 of JP 2013-119131 A. The composite particles can be obtained by, e.g., depositing ceria on the silica particles.

The component A may have, e.g., a substantially spherical shape, a polyhedral shape, or a raspberry-like shape.

The average primary particle size of the component A is preferably 5 nm or more, more preferably 10 nm or more, and further preferably 20 nm or more from the viewpoint of improving the polishing rate. Furthermore, the average primary particle size of the component A is preferably 300 nm or less, more preferably 200 nm or less, and further preferably 150 nm or less from the viewpoint of reducing the occurrence of polishing scratches. More specifically, the average primary particle size of the component A is preferably 5 nm or more and 300 nm or less, more preferably 10 nm or more and 200 nm or less, and further preferably 20 nm or more and 150 nm or less. In the present disclosure, the average primary particle size of the component A is calculated using a BET specific surface area S ($m^2/g$) that is determined by a BET (nitrogen adsorption) method. The BET specific surface area can be measured by a method as described in Examples.

From the viewpoint of improving the polishing rate, the content of the component A in the polishing liquid composition of the present disclosure is preferably 0.001% by mass or more, more preferably 0.05% by mass or more, even more preferably 0.07% by mass or more, and further preferably 0.1% by mass or more with respect to 100% by mass of the total content of the component A, the component B, and water. From the same viewpoint, the content of the component A is preferably 6% by mass or less, more preferably 1% by mass or less, even more preferably 0.7% by mass or less, and further preferably 0.5% by mass or less with respect to 100% by mass of the total content of the component A, the component B, and water. More specifically, the content of the component A is preferably 0.001% by mass or more and 6% by mass or less, more preferably 0.05% by mass or more and 1% by mass or less, even more preferably 0.07% by mass or more and 0.7% by mass or less, and further preferably 0.1% by mass or more and 0.5% by mass or less. When the component A includes a combination of two or more types of ceria particles, the content of the component A is the total content of two or more types of ceria particles.

[Additive (Component B)]

In one or more embodiments, the additive (also referred to simply as a "component B" in the following) contained in the polishing liquid composition of the present disclosure is a compound having a reduction potential of 0.45 V or more when a 10 ppm aqueous solution of the component B is measured by cyclic voltammetry (with an Ag/AgCl electrode as a reference). From the viewpoint of improving the poising rate, the reduction potential is 0.45 V or more, preferably 0.50 V or more, and more preferably 0.55 V or more. Furthermore, the reduction potential is preferably 0.95 V or less, and more preferably 0.90 V or less. The reduction potential can be measured by a method as described in Examples.

In one or more embodiments, from the viewpoint of improving the polishing rate, it is preferable that an oxidation potential of the component B is not detected when a 10 ppm aqueous solution of the component B is measured by cyclic voltammetry (with an Ag/AgCl electrode as a reference). In the present disclosure, "an oxidation potential is not detected" means that the oxidation potential is not detected when a 10 ppm aqueous solution of the component B is automatically measured by an ALS electrochemical analyzer (model 611D). Specifically, it means that the oxidation potential is not measured by a method as described in Examples.

In one or more embodiments, from the viewpoint of improving the polishing rate, the component B is preferably a reducing compound containing a heteroaromatic ring skeleton. Examples of the component B include the following: (i) an N-oxide compound containing a nitrogen-containing heteroaromatic ring skeleton in which at least one hydrogen atom is substituted with a hydroxyl group, or a salt of the N-oxide compound (also referred to as a "component B1" in the following); (ii) an N-oxide compound containing a nitrogen-containing heteroaromatic ring skeleton in which at least one hydrogen atom is substituted with a thiol group, or a salt of the N-oxide compound (also referred to as a "component B2" in the following); and a compound containing a nitrogen-containing heteroaromatic ring skeleton having at least one hydroxyl group and at least one carbonyl group, or a salt of the compound (also referred to as a "component B3" in the following). The component B may include one type or a combination of two or more types of the compounds.

<N-Oxide Compound (Component B1)>

In one aspect, the component B contained in the polishing liquid composition of the present disclosure is an N-oxide compound containing a nitrogen-containing heteroaromatic ring skeleton in which at least one hydrogen atom of the nitrogen-containing heteroaromatic ring is substituted with a hydroxyl group, or a salt of the N-oxide compound (component B1). Examples of the salt include alkali metal salts, alkaline-earth metal salts, organic amine salts, and ammonium salts. The component B1 may be used alone or in combinations of two or more.

Thus, in one aspect, the present disclosure relates to a polishing liquid composition for a silicon oxide film that contains cerium oxide particles (component A), an N-oxide compound (component B1), and an aqueous medium. The component B1 is an N-oxide compound containing a nitrogen-containing heteroaromatic ring skeleton in which at least one hydrogen atom is substituted with a hydroxyl group, or a salt of the N-oxide compound.

In this aspect, the N-oxide compound may be a compound having an N-oxide group (N→O group) in one or more embodiments. The N-oxide compound may have one or more than one N→O group, and preferably one N→O group in terms of easy availability.

In this aspect, the "nitrogen-containing heteroaromatic ring skeleton in which at least one hydrogen atom is substituted with a hydroxyl group" means a structure in which at least one hydrogen atom of the nitrogen-containing heteroaromatic ring is substituted with a hydroxyl group.

In this aspect, at least one nitrogen atom in the nitrogen-containing heteroaromatic ring skeleton of the component B1 forms an N-oxide. In one or more embodiments, the nitrogen-containing heteroaromatic ring of the component B1 may be, e.g., a monocyclic or bicyclic condensed ring. In one or more embodiments, the number of nitrogen atoms in the nitrogen-containing heteroaromatic ring of the component B1 may be 1 to 3. The number of nitrogen atoms is preferably 1 or 2, and more preferably 1 from the viewpoint of improving the polishing rate.

In one or more embodiments, the nitrogen-containing heteroaromatic ring skeleton of the component B1 may be at least one selected from a pyridine N-oxide skeleton, a quinoline N-oxide skeleton, or the like. In the present disclosure, the pyridine N-oxide skeleton indicates a configuration in which the nitrogen atom in the pyridine ring forms an N-oxide. The quinoline N-oxide skeleton indicates a configuration in which the nitrogen atom in the quinoline ring forms an N-oxide.

In one or more embodiments, the component B1 may be at least one selected from an N-oxide compound having a pyridine ring in which at least one hydrogen atom of the pyridine ring is substituted with a hydroxy group, an N-oxide compound having a quinoline ring in which at least one hydrogen atom of the quinoline ring is substituted with a hydroxy group, or salts of these N-oxide compounds. Among them, from the viewpoint of improving the polishing rate, the component B1 is preferably the N-oxide compound having a pyridine ring in which at least one hydrogen atom of the pyridine ring is substituted with a hydroxy group, or a salt of the N-oxide compound.

Specific examples of the component B1 include a 2-hydroxypyridine N-oxide.

<N-Oxide Compound (Component B2)>

In another aspect, the component B contained in the polishing liquid composition of the present disclosure is an N-oxide compound containing a nitrogen-containing heteroaromatic ring skeleton in which at least one hydrogen atom of the nitrogen-containing heteroaromatic ring is substituted with a thiol group, or a salt of the N-oxide compound (component B2). Examples of the salt include alkali metal salts, alkaline-earth metal salts, organic amine salts, and ammonium salts. The component B2 may be used alone or in combinations of two or more.

Thus, in another aspect, the present disclosure relates to a polishing liquid composition for a silicon oxide film that contains cerium oxide particles (component A), an N-oxide compound (component B2), and an aqueous medium. The component B2 is an N-oxide compound containing a nitrogen-containing heteroaromatic ring skeleton in which at least one hydrogen atom is substituted with a thiol group, or a salt of the N-oxide compound.

In this aspect, the N-oxide compound may be a compound having an N-oxide group (N→O group) in one or more embodiments. The N-oxide compound may have one or more than one N→O group, and preferably one N→O group in terms of easy availability.

In this aspect, the "nitrogen-containing heteroaromatic ring skeleton in which at least one hydrogen atom is substituted with a thiol group" means a structure in which at least one hydrogen atom of the nitrogen-containing heteroaromatic ring is substituted with a thiol group.

In this aspect, at least one nitrogen atom in the nitrogen-containing heteroaromatic ring skeleton of the component B2 forms an N-oxide. In one or more embodiments, the nitrogen-containing heteroaromatic ring of the component B2 may be, e.g., a monocyclic or bicyclic condensed ring. In one or more embodiments, the number of nitrogen atoms in the nitrogen-containing heteroaromatic ring of the component B2 may be 1 to 3. The number of nitrogen atoms is preferably 1 or 2, and more preferably 1 from the viewpoint of improving the polishing rate.

In one or more embodiments, the nitrogen-containing heteroaromatic ring skeleton of the component B2 may be at least one selected from a pyridine N-oxide skeleton, a quinoline N-oxide skeleton, or the like. In the present disclosure, the pyridine N-oxide skeleton indicates a configuration in which the nitrogen atom in the pyridine ring forms an N-oxide. The quinoline N-oxide skeleton indicates a configuration in which the nitrogen atom in the quinoline ring forms an N-oxide.

In one or more embodiments, the component B2 may be at least one selected from an N-oxide compound having a pyridine ring in which at least one hydrogen atom of the pyridine ring is substituted with a thiol group (—SH), an N-oxide compound having a quinoline ring in which at least one hydrogen atom of the quinoline ring is substituted with a thiol group (—SH), or salts of these N-oxide compounds. Among them, from the viewpoint of improving the polishing rate, the component B2 is preferably the N-oxide compound having a pyridine ring in which at least one hydrogen atom of the pyridine ring is substituted with a thiol group (—SH), or a salt of the N-oxide compound.

Specific examples of the component B2 include a 2-mercaptopyridine N-oxide.

<Nitrogen-Containing Heteroaromatic Ring Compound (Component B3)>

In another aspect, the component B contained in the polishing liquid composition of the present disclosure is a compound containing a nitrogen-containing heteroaromatic ring skeleton having at least one hydroxyl group and at least one carbonyl group, or a salt of the compound (component B3). Examples of the salt include alkali metal salts, alkaline-earth metal salts, organic amine salts such as ethanolamine salts, and ammonium salts. The component B3 may be used alone or in combinations of two or more.

Thus, in another aspect, the present disclosure relates to a polishing liquid composition that contains polishing abrasive grains (component A), a nitrogen-containing heteroaromatic ring compound (component B3), and an aqueous medium. The component B3 is a compound containing a nitrogen-containing heteroaromatic ring skeleton having at least one hydroxyl group and at least one carbonyl group, or a salt of the compound.

In this aspect, the nitrogen-containing heteroaromatic ring of the component B3 may be, e.g., a monocycle or bicyclic condensed ring in one or more embodiments. In one or more embodiments, the number of nitrogen atoms in the nitrogen-containing heteroaromatic ring of the component B3 may be 1 to 3. The number of nitrogen atoms is preferably 1 or 2, and more preferably 1 from the viewpoint of improving the polishing rate. Moreover, from the viewpoint of improving the polishing rate, it is preferable that the nitrogen-containing heteroaromatic ring skeleton of the component B3 has a hydroxyl group as a substituent of the nitrogen atom of the nitrogen-containing heteroaromatic ring, and has at least one carbonyl group in the nitrogen-containing heteroaromatic ring.

In one or more embodiments, the nitrogen-containing heteroaromatic ring skeleton of the component B3 may be at least one selected from a 1-hydroxypyridine skeleton, a 1-hydroxyquinoline skeleton, or the like. In the present disclosure, the 1-hydroxypyridine skeleton indicates a configuration in which a hydroxyl group is present on the nitrogen atom in the pyridine ring. The 1-hydroxyquinoline skeleton indicates a configuration in which a hydroxyl group is present on the nitrogen atom in the quinoline ring.

In one or more embodiments, the component B3 may be at least one selected from a compound in which a hydroxyl group is a substituent of the nitrogen atom of the pyridine ring, a compound in which a hydroxyl group is a substituent of the nitrogen atom of the quinoline ring, or salts of these compounds. Among them, from the viewpoint of improving the polishing rate, the component B3 is preferably the compound having at least one carbonyl group in the nitrogen-containing heteroaromatic ring, or a salt of the compound.

In one or more embodiments, the component B3 may be a compound represented by the following formula (I) or a salt of the compound.

[Chemical Formula 1]

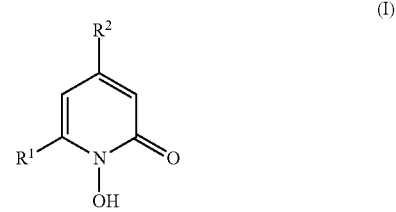

(I)

In the formula (I), $R^1$ represents a hydrogen atom or a hydrocarbon group having 1 to 10 carbon atoms, and is preferably a hydrocarbon group having 1 to 10 carbon atoms from the viewpoint of improving the polishing rate. The hydrocarbon group of $R^1$ may be in any of a linear, branched, or cyclic from. From the viewpoint of improving the polishing rate, the carbon number of $R^1$ may be 1 to 10, preferably 3 to 10, more preferably 4 to 8, and further preferably 5 to 7. From the viewpoint of improving the polishing rate, $R^1$ is preferably a cyclic or branched hydrocarbon group having 3 to 10 carbon atoms. Specific examples of $R^1$ include a cyclohexyl group and a 2,4,4-trimethylpentyl group.

In the formula (I), $R^2$ represents a hydrocarbon group having 1 to 6 carbon atoms, and is preferably a hydrocarbon group having 1 to 3 carbon atoms from the viewpoint of improving the polishing rate. Specific examples of $R^2$ include methyl, ethyl, propyl, and isopropyl groups.

From the viewpoint of improving the polishing rate, the compound represented by the formula (I) is preferably a compound in which $R^1$ is a cyclic or branched hydrocarbon group having 3 to 10 carbon atoms and $R^2$ is a methyl group, more preferably a compound in which $R^1$ is a cyclohexyl group or a 2,4,4-trimethylpentyl group and $R^2$ is a methyl group, and further preferably a compound in which $R^1$ is a cyclohexyl group and $R^2$ is a methyl group.

The component B3 may be, e.g., at least one selected from ciclopirox, piroctone, or their salts. Specific examples of B3 include ciclopirox olamine (6-cyclohexyl-1-hydroxy-4-methyl-2(1H)-pyridone ethanolamine salt) and piroctone olamine (1-hydroxy-4-methyl-6-(2,4,4-trimethylpentyl)-2(1H)-pyridone ethanolamine salt).

In one or more embodiments, from the viewpoint of improving the polishing rate, the content of the component B in the polishing liquid composition of the present disclosure is preferably 0.001% by mass or more, more preferably 0.005% by mass or more, even more preferably 0.01% by mass or more, and further preferably 0.02% by mass or more with respect to 100% by mass of the total content of the component A, the component B, and the aqueous medium. From the same viewpoint, the content of the component B is preferably 1% by mass or less, more preferably 0.5% by mass or less, even more preferably 0.1% by mass or less, and further preferably 0.06% by mass or less with respect to 100% by mass of the total content of the component A, the component B, and the aqueous medium. More specifically, the content of the component B is preferably 0.001% by mass or more and 1% by mass or less, more preferably 0.005% by mass or more and 0.5% by mass or less, even more preferably 0.01% by mass or more and 0.1% by mass or less, and further preferably 0.02% by mass or more and 0.06% by mass or less. When the component B includes a combination of two or more types of the compounds, the content of the component B is the total content of two or more types of the compounds.

In another one or more embodiments, from the viewpoint of improving the polishing rate, the content of the component B in the polishing liquid composition of the present disclosure is preferably 0.0001% by mass or more, more preferably 0.001% by mass or more, even more preferably 0.006% by mass or more, and further preferably 0.01% by mass or more with respect to 100% by mass of the total content of the component A, the component B, and the aqueous medium. From the same viewpoint, the content of the component B is preferably 1% by mass or less, more preferably 0.5% by mass or less, even more preferably 0.1% by mass or less, and further preferably 0.06% by mass or less with respect to 100% by mass of the total content of the component A, the component B, and the aqueous medium. More specifically, the content of the component B is preferably 0.0001% by mass or more and 1% by mass or less, more preferably 0.001% by mass or more and 0.5% by mass or less, even more preferably 0.006% by mass or more and 0.1% by mass or less, and further preferably 0.01% by mass or more and 0.06% by mass or less. When the component B includes a combination of two or more types of the compounds, the content of the component B is the total content of two or more types of the compounds.

In one or more embodiments, from the viewpoint of improving the polishing rate, the mass ratio A/B of the component A to the component B (content of component A/content of component B) in the polishing liquid composition of the present disclosure is preferably 0.001 or more, more preferably 0.1 or more, even more preferably 0.7 or more, and further preferably 1.6 or more. Furthermore, the mass ratio A/B is preferably 6000 or less, more preferably 200 or less, even more preferably 70 or less, and further preferably 25 or less. More specifically, the mass ratio A/B is preferably 0.001 or more and 6000 or less, more preferably 0.1 or more and 200 or less, even more preferably 0.7 or more and 70 or less, and further preferably 1.6 or more and 25 or less.

In another one or more embodiments, from the viewpoint of improving the polishing rate, the mass ratio A/B of the component A to the component B (content of component A/content of component B) in the polishing liquid composition of the present disclosure is preferably 0.001 or more, more preferably 0.1 or more, even more preferably 0.7 or more, and further preferably 1.6 or more. Furthermore, the mass ratio A/B is preferably 6000 or less, more preferably 1000 or less, even more preferably 200 or less, and further preferably 100 or less. More specifically, the mass ratio A/B is preferably 0.001 or more and 6000 or less, more preferably 0.1 or more and 1000 or less, even more preferably 0.7 or more and 200 or less, and further preferably 1.6 or more and 100 or less.

[Aqueous Medium]

Examples of the aqueous medium contained in the polishing liquid composition of the present disclosure include water such as distilled water, ion-exchanged water, pure water, and ultrapure water and a mixed solvent of water and a solvent. The solvent may be any solvent that can be mixed with water (e.g., alcohol such as ethanol). When the aqueous medium is a mixed solvent of water and a solvent, the ratio of water to the total mixed medium is not particularly limited as long as the effects of the present disclosure are not reduced, and is preferably, e.g., 95% by mass or more, more preferably 98% by mass or more, and further preferably substantially 100% by mass in terms of economy. The aqueous medium is preferably water, more preferably ion exchanged water or ultrapure water, and further preferably ultrapure water in terms of the surface cleanliness of a substrate to be polished. The content of the aqueous medium in the polishing liquid composition of the present disclosure may be the remainder obtained by subtracting the component A, the component B, and optional components that may be added as needed (which will be described later) from the amount of the polishing liquid composition.

[Optional Component]

The polishing liquid composition of the present disclosure may further contain optional components such as a pH adjustor, a surfactant, a thickener, a dispersant, a rust preventive, an antiseptic, a basic substance, a polishing rate improver, a silicon nitride film polishing inhibitor, a polysilicon film polishing inhibitor, and counterions. When the polishing liquid composition of the present disclosure further contains optional components, from the viewpoint of improving the polishing rate, the content of the optional components in the polishing liquid composition is preferably 0.001% by mass or more, more preferably 0.0025% by mass or more, and further preferably 0.01% by mass or more. Furthermore, the content of the optional components is preferably 1% by mass or less, more preferably 0.5% by mass or less, and further preferably 0.1% by mass or less. More specifically the content of the optional components is preferably 0.001 by mass or more and 1% by mass or less, more preferably 0.0025% by mass or more and 0.5% by mass or less, and further preferably 0.01% by mass or more and 0.1% by mass or less.

[Polishing Liquid Composition]

The polishing liquid composition of the present disclosure can be produced by a production method that includes blending, e.g., the components the component B, and the aqueous medium, and the optional components as desired, with a known method. For example, the polishing liquid composition may be produced by blending at least the component A, the component B, and the aqueous medium. When the component A includes a combination of two or more types of ceria particles, the component A may be obtained by blending the two or more types of ceria particles. When the component B includes a combination of two or more types of N-oxide compounds, the component B may be obtained by blending the two or more types of N-oxide compounds. When the component B includes a combination of two or more types of nitrogen-containing heteroaromatic ring compounds, the component B may be obtained by blending the two or more types of nitrogen-containing heteroaromatic ring compounds. In the present disclosure, the term "blend" may include mixing the component A, the component B, and the aqueous medium, and the optional components as needed, simultaneously or in sequence. The order of mixing is not particularly limited. The blending can be performed, e.g., with a mixer such as a homomixer, a homogenizer, an ultrasonic disperser, or a wet ball mill. The blending amount of each component in the production method of the polishing liquid composition of the present disclosure may be the same as the content of each component in the polishing liquid composition, as described above.

An embodiment of the polishing liquid composition of the present disclosure may be either a so-called one-part or two-part polishing liquid composition. The one-part polishing liquid composition is supplied to the market with all the components being mixed together. On the other hand, the components of the two-part polishing liquid composition are mixed at the time of use. An embodiment of the two-part polishing liquid composition may include a first solution containing the component A and a second solution containing the component B. The first solution and the second solution may be mixed at the time of use. In this case, the first solution and the second solution may be mixed just before application to the surface of an object to be polished. Alternatively, the first solution and the second solution may be supplied separately and mixed on the surface of a substrate to be polished. Each of the first solution and the second solution may contain the above optional components as needed.

From the viewpoint of improving the polishing rate, the pH of the polishing liquid composition of the present disclosure is preferably 3.5 or more, more preferably 4 or more, and further preferably 4.5 or more. Furthermore, the pH of the polishing liquid composition is preferably 9 or less, more preferably 8.5 or less, even more preferably 8 or less, still more preferably less than 8, yet more preferably 7 or less, and further preferably 6 or less. More specifically, the pH is preferably 3.5 or more and 9 or less, more preferably 4 or more and 8.5 or less, even more preferably 4.5 or more and 8 or less, still more preferably 4.5 or more and less than 8, yet, more preferably 4.5 or more and 7 or less, and further preferably 4.5 or more and 6 or less. In the present disclosure, the pH of the polishing liquid composition is a value at a temperature of 25° C. and can be measured with a pH meter. Specifically, the pH of the polishing liquid composition can be measured by a method as described in Examples.

The "content of each component in the polishing liquid composition" of the present disclosure means the amount of each component at the time of polishing, i.e., at the time the polishing liquid composition starts to be used for polishing. The polishing liquid composition of the present disclosure may be concentrated so as not to impair the stability, and stored and supplied in the concentrated state. This can reduce the production and transportation costs. If necessary, the concentrated solution may be appropriately diluted with water and used in the polishing process. The dilution factor is preferably 5 to 100.

[Film to be Polished]

The film to be polished with the polishing liquid composition of the present disclosure may be, e.g., a silicon oxide film. Thus, the polishing liquid composition of the present disclosure can be used in the process that requires polishing of the silicon oxide film. In one or more embodiments, the polishing liquid composition of the present disclosure is a polishing liquid composition used to polish a silicon oxide film (i.e., a polishing liquid composition for a silicon oxide film). In one or more embodiments, the polishing liquid composition of the present disclosure can be suitably used for the following purposes: polishing of a silicon oxide film in the process of forming an element isolation structure of a semiconductor substrate; polishing of a silicon oxide film in the process of forming an interlayer insulation film; polishing of a silicon oxide film in the process of forming embedded metal wiring; or polishing of a silicon oxide film in the process of forming an embedded capacitor. In another one or more embodiment, the polishing liquid composition of the present disclosure can be suitably used for the production of a three-dimensional semiconductor device such as a three-dimensional NAND flash memory

[Polishing Liquid Kit]

In another aspect, the present disclosure relates to a kit (also referred to as a "polishing liquid kit of the present disclosure" in the following) for producing the polishing liquid composition of the present disclosure.

An embodiment of the polishing liquid kit of the present disclosure may be, e.g., a polishing liquid kit (two-part polishing liquid composition) including a polishing abrasive grain dispersion and an additive aqueous solution so that they are not mixed with each other. The polishing abrasive grain dispersion contains the component A and the aqueous medium, and the additive aqueous solution contains the component B. The polishing abrasive grain dispersion and the additive aqueous solution are mixed at the time of use, which may be diluted with the aqueous medium as needed. The aqueous medium contained in the polishing abrasive grain dispersion may correspond to the whole or part of the amount of the aqueous medium used for the preparation of the polishing liquid composition. The additive aqueous solution may contain a part of the aqueous medium used for the preparation of the polishing liquid composition. Each of the polishing abrasive grain dispersion and the additive aqueous solution may contain the above optional components as needed.

The polishing liquid kit of the present disclosure can provide a polishing liquid composition capable of improving the polishing selectivity while ensuring the polishing rate.

[Method for Producing Semiconductor Substrate]

In one aspect, the present disclosure relates to a method for producing a semiconductor substrate (also referred to as a "production method of a semiconductor substrate of the present disclosure" in the following). The method includes polishing a silicon oxide film with the polishing liquid composition of the present disclosure (also referred to as a "polishing process using the polishing liquid composition of the present disclosure" in the following). The production method of a semiconductor substrate of the present disclosure can improve the polishing rate of the silicon oxide film, and therefore can be effective in efficiently producing a high-quality semiconductor substrate.

A specific example of the production method of a semiconductor substrate of the present disclosure is as follows. First, a silicon substrate is exposed to oxygen in an oxidation furnace so that a silicon dioxide layer is grown on the surface of the silicon substrate. Then, a polishing stopper film such as a silicon nitride ($Si_3N_4$) film or a polysilicon film is formed on the silicon dioxide layer e.g., a CVD method (chemical vapor deposition method). Next, a trench is formed by a photolithography technique in a substrate that includes the silicon substrate and the polishing stopper film provided on one of the main surfaces of the silicon substrate, e.g., in a substrate that includes the silicon substrate and the polishing stopper film provided on the silicon dioxide layer of the silicon substrate. Subsequently, a silicon oxide ($SiO_2$) film (i.e., a film to be polished) is formed to fill the trench by, e.g., a CVD method using a silane gas and an oxygen gas. Thus, the polishing stopper film is covered with the film to be polished (silicon oxide film), resulting in a substrate to be polished. Because of the formation of the silicon oxide film, the trench is filled with silicon oxide of the silicon oxide film, and the surface of the polishing stopper film that is opposite to the other surface facing the silicon substrate is covered with the silicon oxide film. Consequently the surface of the silicon oxide film that is opposite to the other surface facing the silicon substrate has a step according to the unevenness of the underlying layer. Then, the silicon oxide film is polished by a CMP method until at least the surface of the polishing stopper film that is opposite to the other surface facing the silicon substrate is exposed. More preferably, the silicon oxide film is polished until the surface of the silicon oxide film is flush with the surface of the polishing stopper film. The polishing liquid composition of the present disclosure can be used in this polishing process by the CMP method. The silicon oxide film has projections and recesses according to the unevenness of the underlying layer, and the width of a projection may be, e.g., 0.5 μm or more and 5000 μm or less and the width of a recess may be, e.g., 0.5 μm or more and 5000 μm or less.

In the polishing process by the CMP method, the surface of the substrate to be polished is brought into contact with a polishing pad, and the substrate and the polishing pad are moved relative to each other while the polishing liquid composition of the preset disclosure is being supplied to the contact area between them, so that the uneven portion of the surface of the substrate is planarized.

In the production method of a semiconductor substrate of the present disclosure, another insulation film may be formed between the silicon dioxide layer of the silicon substrate and the polishing stopper film. Alternatively, another insulation film may be formed between the film to be polished (e.g., the silicon oxide film) and the polishing stopper film (e.g., the silicon nitride film).

In the polishing process using the polishing liquid composition of the present disclosure, the rotation speed of the polishing pad may be, e.g., 30 to 200 r/min, the rotation speed of the substrate to be polished may be, e.g., 30 to 200 r/min, the polishing load set in the polishing apparatus including the polishing pad may be, e.g., 20 to 500 g weight/cm$^2$, and the supply rate of the polishing liquid composition may be, e.g., 10 to 500 mL/min or less. When the polishing liquid composition is a two-part polishing liquid composition, the supply rate (or the amount of supply) of each of the first solution and the second solution can be adjusted to control the polishing rate of the film to be polished, the polishing rate of the polishing stopper film, and the ratio of the polishing rate of the polishing stopper film to the polishing rate of the film to be polished (i.e., the polishing selectivity).

In the polishing process using the polishing liquid composition of the present disclosure, the polishing rate of the film to be polished (silicon oxide film) is preferably 50 nm/min or more, more preferably 80 nm/min or more, and further preferably 90 nm/min or more from the viewpoint of improving the productivity.

[Polishing Method]

In one aspect, the present disclosure relates to a polishing method (also referred to as a "polishing method of the present disclosure" in the following) that includes polishing a film to be substrate with the polishing liquid composition of the present disclosure. The polishing method of the present disclosure can improve the polishing rate of the silicon oxide film, and therefore can be effective in improving the productivity of a high-quality semiconductor substrate. The specific polishing method and conditions may be the same as those of the production method of a semiconductor substrate of the present disclosure, as described above.

EXAMPLES

Hereinafter, the present disclosure will be described by way of examples. However, the present disclosure is not limited to the following examples.

1. Method for Measuring Each Parameter (1) pH of Polishing Liquid Composition

The pH value of the polishing liquid composition at 25° C. was measured with a pH meter ("HM-30G" manufactured by DKK-TOA CORPORATION). Specifically, an electrode of the pH meter was immersed in the polishing liquid composition, and the pH value was obtained 1 minute after the immersion.

(2) Average Primary Particle Size of Ceria Particles (Component A)

The average primary particle size (nm) of the ceria particles (component A) was calculated using a specific surface area S (m$^2$/g) that was determined by the following BET (nitrogen adsorption) method, where the true density of the ceria particles was set to 7.2 g/cm$^3$.

(3) BET Specific Surface Area of Ceria Particles (Component A)

The specific surface area was measured in the following manner. A ceria dispersion was dried with hot air at 120° C. for 3 hours, and then finely pulverized in an agate mortar, providing a sample. The sample was dried in an atmosphere at 120° C. for 15 minutes immediately before measuring the specific surface area. Then, the specific surface area was measured by the nitrogen adsorption method (BET method) using a specific surface area measuring device (Micromeritics Automatic Surface Area Analyzer "FlowSorb III 2305" manufactured by Shimadzu Corporation).

(4) Reduction Potential and Oxidation Potential

1) A sodium sulfate aqueous solution (supporting electrolyte) was prepared with ultrapure water so that its concentration was 0.1 mol/L, and nitrogen substitution was performed for at least 3 hours.

2) 9.9 mL of the sodium sulfate aqueous solution was weighed in a glass vial (20 mL).

3) Using 1 μm diamond for polishing and a diamond polishing pad (both are manufactured by BAS Inc.), the surface of a glassy carbon working electrode was polished in such a manner that the electrode was pressed vertically against the polishing pad and fully polished so as to draw a figure-eight on the polishing pad. Subsequently using 0.05 μm alumina for polishing and an alumina polishing pad (both are manufactured by BAS Inc.), the above electrode was fully polished so as to draw a figure-eight on the polishing pad until the surface of the electrode became a mirror surface. Then, the surface of the electrode was cleaned with ultrapure water and dried.

4) The glassy carbon electrode, a silver/silver chloride reference electrode, and a platinum counter electrode were connected to an ALS electrochemical analyzer (model 611D) and immersed in the sodium sulfate aqueous solution. Thus, a tripolar electrochemical cell was assembled.

5) Variables in cyclic voltammetry were set as follows: a high potential was 1 V; a low potential was 1 V a scanning speed was 0.1 V/s; and a sweep segment was 5 w. The potential versus current data points were displayed on the monitor.

6) A Teflon (registered trademark) tube was inserted into the glass vial, and nitrogen substitution was sufficiently performed, followed by a measurement using only the supporting electrolyte. In this case, if the nitrogen substitution was insufficient, a peak derived from the dissolved oxygen would be detected.

7) A measurement sample (additive: 1000 ppm) was prepared with ultrapure water, and nitrogen substitution was sufficiently performed. Then, 0.1 mL of the measurement sample was added to 9.9 mL of the sodium sulfate aqueous solution in the glass vial, so that a 10 ppm aqueous solution of the additive was obtained.

8) An open circuit potential was measured and set to an initial potential of the variable in cyclic voltammetry and the measurement was performed. In this case, an oxidation-reduction potential was observed from the cyclic voltammogram derived from the measurement sample, while confirming that no peak derived from the dissolved oxygen was detected.

2. Preparation of Polishing Liquid Composition
(Examples 1 to 4 and Comparative Examples 1 to 10)

Ceria particles (component A), additives (component B or non-component B shown in Table 1), and water were mixed together to prepare polishing liquid compositions of Examples 1 to 4 and Comparative Examples 1 to 10. The content of each component in the polishing liquid composition was as follows. The content of the component A was 0.15% by mass. The content of the component B or non-component B was 0.01% by mass. The content of water was the remainder obtained by subtracting the component A and the component B or non-component B from the amount of the polishing liquid composition. The polishing liquid compositions of Examples 1 to 4 and Comparative Examples 1 to 10 had a pH of 5. The pH was adjusted by using ammonia or nitric acid.

The component A, the component B, and the non-component B used in the preparation of the polishing liquid compositions of Examples 1 to 4 and Comparative Examples 1 to 10 are as follows.

Colloidal ceria ("HC30" manufactured by SOLVAY, average primary particle size: 26 nm, BET specific surface area: 32 m$^2$/g) (component A)

2-hydroxypyridine N-oxide (manufactured by Tokyo Chemical Industry Co., Ltd.) (component B)

2-mercaptopyridine N-oxide (manufactured by Tokyo Chemical Industry Co., Ltd.) (Component B)

Pyridine N-oxide (manufactured by Tokyo Chemical Industry Co., Ltd.) (non-component B)

2-hydroxypyridine (manufactured by Tokyo Chemical Industry Co., Ltd.) (non-component B)

4-methoxypyridine N-oxide (manufactured by FUJIFILM Wako Chemical Corporation) (non-component B)

4-chloropyridine N-oxide (manufactured by Tokyo Chemical Industry Co., Ltd.) (non-component B)

4-nitropyridine N-oxide (manufactured by FUJIFILM Wako Chemical Corporation) (non-component B)

Catechol (manufactured by Tokyo Chemical Industry Co., Ltd.) (non-component B)

Ascorbic acid (manufactured by FUJIFILM Wako Chemical Corporation) (non-component B)

Picolinic acid (manufactured by Tokyo Chemical Industry Co., Ltd.) (non-component B)

Picolinic acid-N-oxide (manufactured by FUJIFILM Wako Chemical Corporation) (non-component B)

3. Evaluation of Polishing Liquid Composition
(Examples 1 to 4 and Comparative Examples 1 to 10)

[Evaluation Sample]

A commercially available wafer for evaluating CMP characteristics ("T-TEOS MIT 864 PT wafer" manufactured by ADVANTEC, diameter: 200 mm) was prepared as an evaluation sample. The wafer was cut to 40 mm×40 mm. This evaluation sample had been etched to make a linear pattern of projections and recesses. Each projection had a structure in which a silicon nitride film (first layer) with a thickness of 150 nm was disposed on a silicon substrate, and a silicon oxide film (second layer) with a thickness of 450 nm was disposed on the silicon nitride film. Similarly, the silicon oxide film with a thickness of 450 nm was provided in each recess. A difference in level between the projection and the recess was 350 nm. The silicon oxide film was composed of P-TEOS. The silicon oxide film located in the projection and the recess, each having a line width of 100 μm, and the silicon oxide film located in the projection and the recess, each having a line width of 500 μm, were used as measuring objects.

[Polishing Conditions]

Polishing device: single-sided polishing machine ("TR15M-TRK1" manufactured by Techno Rise Corporation, surface plate diameter: 380 mm)

Polishing pad: hard urethane pad ("IC-1000/Suba 400" manufactured by Nitta Haas Inc.)

Surface plate rotation speed: 90 rpm

Head rotation speed: 90 rpm

Polishing load: 300 g weight/cm$^2$

Supply of polishing liquid: 50 ml/min

Polishing time: 1 minute

[Measurement of Polishing Rate]

The patterned substrates were polished with the polishing liquid compositions of Examples 1 to 4 and Comparative Examples 1 to 10 under the polishing conditions described above. Each of the polished substrates was cleaned with ultrapure water and dried. Then, the resulting test piece was used as a measuring object for an optical interference type film thickness measuring device, as will be described below.

The thickness of the silicon oxide film was measured before and after polishing by the optical interference type film thickness measuring device ("VM-1230" manufactured by SCREEN Semiconductor Solutions Co., Ltd.). The polishing rate of the silicon oxide film was calculated by the following formula. Table 1 shows the calculation results. Table 1 also shows the relative value of the polishing rate when the value of Comparative Example 10 was set to 1.0 as a reference.

Polishing rate of silicon oxide film (nm/min)=[thickness of silicon oxide film before polishing (nm)−thickness of silicon oxide film after polishing (nm)]/polishing time (min)

Colloidal ceria ("HC30" manufactured by SOLVAY, average primary particle size: 26 nm, BET specific surface area: 32 $m^2/g$) (component A)

Irregularly-shaped ceria (average primary particle size: 19 nm, BET specific surface area: 44 $m^2/g$) (component A)

2-hydroxypyridine N-oxide (manufactured by Tokyo Chemical Industry Co., Ltd.) (component B1)

Pyridine N-oxide (manufactured by Tokyo Chemical Industry Co., Ltd.) (non-component B)

4-hydroxypyridine (manufactured by Tokyo Chemical Industry Co., Ltd.) (non-component B)

TABLE 1

| | Polishing liquid composition | | | | Polishing rate | | | |
|---|---|---|---|---|---|---|---|---|
| | | Additive (component B) | | | Pattern (projection: 500 μm) | | Pattern (projection: 100 μm) | |
| | Ceria particles (component A) | Type | Reduction potential (V) | Oxidation potential (V) | (nm/min) | Relative value | (nm/min) | Relative value |
| Ex. 1 | colloidal ceria | 2-hydroxypyridine N-oxide | 0.8733 | undetected | 97 | 2.3 | 116 | 3.1 |
| Ex. 2 | colloidal ceria | 2-mercaptopyridine N-oxide | 0.4771 | undetected | 87 | 2.0 | 100 | 2.7 |
| Ex. 3 | colloidal ceria | ciclopirox olamine | 0.5899 | undetected | 261 | 6.1 | 361 | 9.8 |
| Ex. 4 | colloidal ceria | piroctone olamine | 0.5483 | undetected | 107 | 2.5 | 140 | 3.8 |
| Comp. Ex. 1 | colloidal ceria | pyridine N-oxide (non-component B) | undetected | undetected | 26 | 0.6 | 16 | 0.4 |
| Comp. Ex. 2 | colloidal ceria | 2-hydroxypyridine (non-component B) | undetected | undetected | 26 | 0.6 | 14 | 0.4 |
| Comp. Ex. 3 | colloidal ceria | 4-methoxypyridine N-oxide (non-component B) | undetected | undetected | 60 | 1.4 | 46 | 1.2 |
| Comp. Ex. 4 | colloidal ceria | 4-chloropyridine N-oxide (non-component B) | undetected | undetected | 50 | 1.2 | 40 | 1.1 |
| Comp. Ex. 5 | colloidal ceria | 4-nitropyridine N-oxide (non-component B) | −0.1152 | −0.4245 | 45 | 1.0 | 31 | 0.8 |
| Comp. Ex. 6 | colloidal ceria | catechol (non-component B) | 0.4261 | 0.2969 | 61 | 1.4 | 42 | 1.1 |
| Comp. Ex. 7 | colloidal ceria | ascorbic acid (non-component 8) | 0.1607 | undetected | 55 | 1.3 | 46 | 1.2 |
| Comp. Ex. 8 | colloidal ceria | picolinic acid (non-component B) | undetected | undetected | 60 | 1.4 | 67 | 1.8 |
| Comp. Ex. 9 | colloidal ceria | picolinic acid-N-oxide | undetected | undetected | 60 | 1.4 | 78 | 2.1 |
| Comp. Ex. 10 | colloidal ceria | — | undetected | undetected | 43 | 1.0 | 37 | 1.0 |

The present disclosure will be further described by way of other examples. However, the present disclosure is not limited to the following examples.

4. Preparation of Polishing Liquid Composition (Examples 1, 5 and Comparative Examples 1 to 2, 10 to 13)

Ceria particles (component A), additives (component B1 or non-component B shown in Table 2), and water were mixed together to prepare polishing liquid compositions of Examples 1, 5 and Comparative Examples 1 to 2, 10 to 13. The content of each component in the polishing liquid composition was as follows. The content of the component A was 0.15% by mass. The content of the component B1 or non-component B was as shown in Table 2. The content of water was the remainder obtained by subtracting the component A and the component B1 or non-component B from the amount of the polishing liquid composition. The polishing liquid compositions of Examples 1, 5 and Comparative Examples 1 to 2, 10 to 13 had a pH of 5. The pH was adjusted by using ammonia or nitric acid.

The component A, the component B1, and the non-component B used in the preparation of the polishing liquid compositions are as follows.

2-hydroxypyridine (manufactured by Tokyo Chemical Industry Co., Ltd.) (non-component B)

5. Evaluation of Polishing Liquid Composition (Examples 1, 5 and Comparative Examples 1 to 2, 10 to 13)

[Evaluation Sample]

A commercially available wafer for evaluating CMP characteristics ("T-TEOS MIT 864 PT wafer" manufactured by ADVANTEC, diameter: 200 mm) was prepared as an evaluation sample. The wafer was cut to 40 mm×40 mm. This evaluation sample had been etched to make a linear pattern of projections and recesses. Each projection had a structure in which a silicon nitride film (first layer) with a thickness of 150 nm was disposed on a silicon substrate, and a silicon oxide film (second layer) with a thickness of 450 nm was disposed on the silicon nitride film. Similarly, the silicon oxide film with a thickness of 450 nm was provided in each recess. A difference in level between the projection and the recess was 350 nm. The silicon oxide film was composed of P-TEOS. The silicon oxide film located in the projection and the recess, each having a line width of 100 μm, and the silicon oxide film located in the projection and the recess, each having a line width of 500 μm, were used as measuring objects.

[Polishing Conditions]
Polishing device: single-sided polishing machine ("TR15M-TRK1" manufactured by Techno Rise Corporation, surface plate diameter: 380 mm)
Polishing pad: hard urethane pad ("IC-1000/Suba 400" manufactured by Nitta Haas Inc.)
  Surface plate rotation speed: 90 rpm
  Head rotation speed: 90 rpm
  Polishing load: 300 g weight/cm$^2$
  Supply of polishing liquid: 50 mL/min
  Polishing time: 1 minute
[Measurement of Polishing Rate]
The patterned substrates were polished with the polishing liquid compositions of Examples 1, 5 and Comparative Examples 1 to 2, 10 to 13 under the polishing conditions described above. Each of the polished substrates was cleaned with ultrapure water and dried. Then, the resulting test piece was used as a measuring object for an optical interference type film thickness measuring device, as will be described below.

The thickness of the silicon oxide film was measured before and after polishing by the optical interference type film thickness measuring device ("VM-1230" manufactured by SCREEN Semiconductor Solutions Co., Ltd.). The polishing rate of the silicon oxide film was calculated by the following formula. Table 2 shows the calculation results. Table 2 also shows the relative value of the polishing rate when the value of Comparative Example 10 was set to 1 as a reference.

Polishing rate of silicon oxide film (nm/min)=[thickness of silicon oxide film before polishing (nm)−thickness of silicon oxide film after polishing (nm)]/polishing time (min)

The present disclosure will be further described by way of other examples. However, the present disclosure is not limited to the following examples.

6. Preparation of Polishing Liquid Composition (Examples 2, 6 to 7 and Comparative Examples 1, 3 to 5, 10 to 11, 13)

Ceria particles (component A), additives (component B2 or non-component B shown in Table 3), and water were mixed together to prepare polishing liquid compositions of Examples 2, 6 to 7 and Comparative Examples 1, 3 to 5, 10 to 11, 13. The content (active part) of each component in the polishing liquid composition was as follows. The content of the component A was 0.15% by mass. The content (% by mass) of the component B2 or non-component B was as shown in Table 3. The content of water was the remainder obtained by subtracting the component A and the component B2 or non-component B from the amount of the polishing liquid composition. The polishing liquid compositions of Examples 2, 6 to 7 and Comparative Examples 1, 3 to 5, 10 to 11, 13 had a pH of 5. The pH was adjusted by using ammonia or nitric acid.

The component A, the component B2, and the non-component B used in the preparation of the polishing liquid compositions are as follows.

Colloidal ceria ("HC30" manufactured by SOLVAY, average primary particle size: 26 nm, BET specific surface area: 32 m$^2$/g) (component A)

Irregularly-shaped ceria (average primary particle size: 19 nm, BET specific surface area: 44 m$^2$/g) (component A)

2-mercaptopyridine N-oxide (manufactured by Tokyo Chemical Industry Co., Ltd.) (Component B2)

TABLE 2

| | Polishing liquid composition | | | Polishing rate | | | |
| --- | --- | --- | --- | --- | --- | --- | --- |
| | | Additive (component B1) | | Pattern (projection: 500 μm) | | Pattern (projection: 100 μm) | |
| | Ceria particles (component A) | Type | Amount of addition (% by mass) | (nm/min) | Relative value | (nm/min) | Relative value |
| Ex. 1 | colloidal ceria | 2-hydroxypyridine N-oxide | 0.01 | 97 | 2.2 | 116 | 3.1 |
| Ex. 5 | irregularly-shaped ceria | 2-hydroxypyridine N-oxide | 0.01 | 130 | 3.0 | 123 | 3.3 |
| Comp. Ex. 10 | colloidal ceria | — | 0 | 43 | 1.0 | 37 | 1.0 |
| Comp. Ex. 1 | colloidal ceria | pyridine N-oxide (non-component B) | 0.01 | 26 | 0.6 | 16 | 0.4 |
| Comp. Ex. 11 | colloidal ceria | pyridine N-oxide (non-component B) | 0.05 | 37 | 0.9 | 35 | 0.9 |
| Comp. Ex. 12 | colloidal ceria | 4-hydroxypyridine (non-component B) | 0.01 | 56 | 1.3 | 43 | 1.2 |
| Comp. Ex. 2 | colloidal ceria | 2-hydroxypyridine (non-component B) | 0.01 | 26 | 0.6 | 14 | 0.4 |
| Comp. Ex. 13 | irregularly-shaped ceria | — | 0 | 19 | 0.4 | 7 | 0.2 |

As shown in Table 2, the polishing rate of the silicon oxide film was more improved in Examples 1, 5 which used the component B1 than in Comparative Examples 1 to 2, 10 to 13 which did not use the component B1.

Pyridine N-oxide (manufactured by Tokyo Chemical Industry Co., Ltd.) (non-component B)

4-chloropyridine N-oxide (manufactured by Tokyo Chemical Industry Co., Ltd.) (non-component B)

4-nitropyridine N-oxide (manufactured by FUJIFILM Wako Chemical Corporation) (non-component B)

4-methoxypyridine N-oxide (manufactured by FUJIFILM Wako Chemical Corporation) (non-component B)

7. Evaluation of Polishing Liquid Composition (Examples 2, 6 to 7 and Comparative Examples 1, 3 to 5, 10 to 11, 13)

[Evaluation Sample]

A commercially available wafer for evaluating CMP characteristics ("T-TEOS MIT 864 PT wafer" manufactured by ADVANTEC, diameter: 200 mm) was prepared as an evaluation sample. The wafer was cut to 40 mm×40 mm. This evaluation sample had been etched to make a linear pattern of projections and recesses. Each projection had a structure in which a silicon nitride film (first layer) with a thickness of 150 nm was disposed on a silicon substrate, and a silicon oxide film (second layer) with a thickness of 450 nm was disposed on the silicon nitride film. Similarly, the silicon oxide film with a thickness of 450 nm was provided in each recess. A difference in level between the projection and the recess was 350 nm. The silicon oxide film was composed of P-TEOS. The silicon oxide film located in the projection and the recess, each having a line width of 100 μm, and the silicon oxide film located in the projection and the recess, each having a line width of 500 μm, were used as measuring objects.

[Polishing Conditions]

Polishing device: single-sided polishing machine ("TR15M-TRK1" manufactured by Techno Rise Corporation, surface plate diameter: 380 mm)

Polishing pad: hard urethane pad ("IC-1000 Suba 400" manufactured by Nitta Haas Inc.)

Surface plate rotation speed: 90 rpm

Head rotation speed: 90 rpm

Polishing load: 300 g weight/cm$^2$

Supply of polishing liquid: 50 mL/min

Polishing time: 1 minute

[Measurement of Polishing Rate]

The patterned substrates were polished with the polishing liquid compositions of Examples 2, 6 to 7 and Comparative Examples 1, 3 to 5, 10 to 11, 13 under the polishing conditions described above. Each of the polished substrates was cleaned with ultrapure water and dried. Then, the resulting test piece was used as a measuring object for an optical interference type film thickness measuring device, as will be described below.

The thickness of the silicon oxide film was measured before and after polishing by the optical interference type film thickness measuring device ("VM-1230" manufactured by SCREEN Semiconductor Solutions Co., Ltd.). The polishing rate of the silicon oxide film was calculated by the following formula. Table 3 shows the calculation results. Table 3 also shows the relative value of the polishing rate when the value of Comparative Example 10 was set to 1 as a reference.

Polishing rate of silicon oxide film (nm/min)=[thickness of silicon oxide film before polishing (nm)−thickness of silicon oxide film after polishing (nm)]/polishing time (min)

TABLE 3

| | Polishing liquid composition | | | Polishing rate | | | |
| | | Additive (component B2) | | Pattern (projection: 500 μm) | | Pattern (projection: 100 μm) | |
| | Ceria particles (component A) | Type | Amount of addition (% by mass) | (nm/min) | Relative value | (nm/min) | Relative value |
|---|---|---|---|---|---|---|---|
| Ex. 2 | colloidal ceria | 2-mercaptopyridine N-oxide | 0.01 | 87 | 2.0 | 100 | 2.7 |
| Ex. 6 | colloidal ceria | 2-mercaptopyridine N-oxide | 0.05 | 97 | 2.2 | 125 | 3.4 |
| Ex. 7 | irregularly-shaped ceria | 2-mercaptopyridine N-oxide | 0.01 | 95 | 2.2 | 115 | 3.1 |
| Comp. Ex. 10 | colloidal ceria | — | 0 | 43 | 1.0 | 37 | 1.0 |
| Comp. Ex 1 | colloidal ceria | pyridine N-oxide (non-component B) | 0.01 | 26 | 0.6 | 16 | 0.4 |
| Comp. Ex. 11 | colloidal ceria | pyridine N-oxide (non-component B) | 0.05 | 37 | 0.9 | 35 | 0.9 |
| Comp. Ex 4 | colloidal ceria | 4-chlorapyridine N-oxide (non-component B) | 0.01 | 50 | 1.2 | 40 | 1.1 |
| Comp. Ex 5 | colloidal ceria | 4-nitropyridine N-oxide (non-component B) | 0.01 | 45 | 1.0 | 31 | 0.8 |
| Comp. Ex 3 | colloidal ceria | 4-methoxypyridine N-oxide (non-component B) | 0.01 | 60 | 1.4 | 46 | 12 |
| Comp. Ex. 13 | irregularly-shaped ceria | — | 0 | 19 | 0.4 | 7 | 0.2 |

As shown in Table 3, the polishing rate of the silicon oxide film located in the projection was more improved in Examples 2, 6 to 7 which used the component B2 than in Comparative Examples 1, 3 to 5, 10 to 11, 13 which did not use the component B2.

The present disclosure will be further described by way of other examples. However, the present disclosure is not limited to the following examples.

8. Preparation of Polishing Liquid Composition (Examples 3 to 4, 8 to 10 and Comparative Examples 10, 13)

Ceria particles (component A), additives (component B3 shown in Table 4), and water were mixed together to prepare polishing liquid compositions of Examples 3 to 4, 8 to 10 and Comparative Examples 10, 13. The content of each component in the polishing liquid composition was as follows. The content of the component A was 0.15% by mass. The content of the component B3 was as shown in Table 4. The content of water was the remainder obtained by subtracting the component A and the component B3 from the amount of the polishing liquid composition. The polishing liquid compositions of Examples 3 to 4, 9 to 10 and Comparative Examples 10, 13 had a pH of 5. The polishing liquid composition of Example 8 had a pH of 7. The pH was adjusted by using ammonia or nitric acid.

The component A and the component B3 used in the preparation of the polishing liquid compositions are as follows.

Colloidal ceria ("HC30" manufactured by SOLVAY, average primary particle size: 26 nm, BET specific surface area: 32 m²/g) (component A)

Irregularly-shaped ceria (average primary particle size: 19 nm, BET specific surface area: 44 m²/g) (component A)

Ciclopirox olamine (manufactured by Tokyo Chemical Industry Co., Ltd.) (non-component B3)

Piroctone olamine (manufactured by Tokyo Chemical Industry Co., Ltd.) (non-component B3)

9. Evaluation of Polishing Liquid Composition (Examples 3 to 4, 8 to 10 and Comparative Examples 10, 13)

[Evaluation Sample]
<Blanket Substrate>

A silicon oxide film (blanket film) with a thickness of 2000 nm was formed on one side of a silicon wafer by a TEOS-plasma CVD method. A square piece of 40 mm×40 mm was cut from the silicon wafer having the silicon oxide film, providing a silicon oxide film test piece (blanket substrate).

<Patterned Substrate>

A commercially available wafer for evaluating CMP characteristics ("T-TEOS MIT 864 PT wafer" manufactured by ADVANTEC, diameter: 200 mm) was prepared as an evaluation sample. The wafer was cut to 40 mm×40 mm. This evaluation sample had been etched to make a linear pattern of projections and recesses. Each projection had a structure in which a silicon nitride film (first layer) with a thickness of 150 nm was disposed on a silicon substrate, and a silicon oxide film (second layer) with a thickness of 450 nm was disposed on the silicon nitride film. Similarly, the silicon oxide film with a thickness of 450 nm was provided in each recess. A difference in level between the projection and the recess was 350 nm. The silicon oxide film was composed of P-TEOS. The silicon oxide film located in the projection and the recess, each having a line width of 100 µm, and the silicon oxide film located in the projection and the recess, each having a line width of 500 µm, were used as measuring objects.

[Polishing Conditions]

Polishing device: single-sided polishing machine ("TR15M-TRK1" manufactured by Techno Rise Corporation, surface plate diameter: 380 mm)

Polishing pad: hard urethane pad ("IC-1000/Suba 400" manufactured by Nitta Haas Inc.)

Surface plate rotation speed: 90 rpm
Head rotation speed: 90 rpm
Polishing load: 300 g weight/cm²
Supply of polishing liquid: 50 mL/min
Polishing time: 1 minute

[Measurement of Polishing Rate]

The patterned substrates were polished with the polishing liquid compositions of Examples 3 to 4, 8 to 10 and Comparative Examples 10, 13 under the polishing conditions described above. Each of the polished substrates was cleaned with ultrapure water and dried. Then, the resulting test piece was used as a measuring object for an optical interference type film thickness measuring device, as will be described below.

The thickness of the silicon oxide film was measured before and after polishing by the optical interference type film thickness measuring device ("VM-1230" manufactured by SCREEN Semiconductor Solutions Co., Ltd.). The polishing rate of the silicon oxide film was calculated by the following formula. Table 4 shows the calculation results. Table 4 also shows the relative value of the polishing rate when the value of Comparative Example 10 was set to 1.0 as a reference.

Polishing rate of silicon oxide film (nm/min)=[thickness of silicon oxide film before polishing (nm)−thickness of silicon oxide film after polishing (nm)]/polishing time (min)

TABLE 4

| | Polishing liquid composition | | | | Polishing rate | | | | |
| --- | --- | --- | --- | --- | --- | --- | --- | --- | --- |
| | | Additive (component B3) | | | | | Pattern | | Pattern |
| | | | Amount of | | Blanket | | (projection: 500 µm) | | (projection: 100 µm) |
| | Ceria particles (component A) | Type | addition (% by mass) | pH | (nm/min) | Relative value | (nm/min) | Relative value | (nm/min) | Relative value |
| Ex. 3 | colloidal ceria | ciclopirox olamine | 0.01 | 5 | 144 | 3.3 | 261 | 6.1 | 361 | 9.8 |
| Ex. 8 | colloidal ceria | ciclopirox olamine | 0.01 | 7 | 226 | 5.3 | 275 | 6.4 | 315 | 8.5 |
| Ex. 9 | colloidal ceria | ciclopirox olamine | 0.006 | 5 | 186 | 4.3 | 243 | 5.7 | 260 | 7.0 |
| Ex. 4 | colloidal ceria | piroctone olamine | 0.01 | 5 | 171 | 4.0 | 107 | 2.5 | 140 | 3.8 |
| Ex. 10 | irregularly-shaped ceria | ciclopirox olamine | 0.01 | 5 | 121 | 2.8 | 110 | 2.6 | 130 | 3.5 |
| Comp. Ex. 10 | colloidal ceria | — | 0 | 5 | 43 | 1.0 | 43 | 1.0 | 37 | 1.0 |
| Comp. Ex. 13 | irregularly-shaped ceria | — | 0 | 5 | 25 | 1.0 | 19 | 0.4 | 7 | 0.2 |

As shown in Table 4, the polishing rate of the silicon oxide film was more improved in Examples 3 to 4, 8 to 10 which used the component B3 than in Comparative Examples 10, 13 which did not use the component B3.

INDUSTRIAL APPLICABILITY

The polishing liquid composition of the present disclosure is useful in a method for producing a semiconductor substrate for high density or high integration.

The invention claimed is:

1. A polishing liquid composition for a silicon oxide film comprising:
    cerium oxide particles as component A;
    an additive as component B; and
    an aqueous medium,
    wherein the component B is a compound having a reduction potential of 0.45 V or more when a 10 ppm aqueous solution of the component B is measured by cyclic voltammetry, with an Ag/AgCl electrode as a reference,
    an oxidation potential of the component B is not detected when a 10 ppm aqueous solution of the component B is measured by cyclic voltammetry with an Ag/AgCl electrode as a reference,
    the component B is a reducing compound containing a heteroaromatic ring skeleton, and
    a content of the component B is 0.001% by mass or more and 0.1% by mass or less.

2. The polishing liquid composition according to claim 1, wherein the component B is component B1 which is an N-oxide compound containing a nitrogen-containing heteroaromatic ring skeleton in which at least one hydrogen atom is substituted with a hydroxyl group, or a salt of the N-oxide compound.

3. The polishing liquid composition according to claim 2, wherein the component B1 is at least one selected from an N-oxide compound having a pyridine ring in which at least one hydrogen atom is substituted with a hydroxyl group, an N-oxide compound having a quinoline ring in which at least one hydrogen atom is substituted with a hydroxyl group, or salts of these N-oxide compounds.

4. The polishing liquid composition according to claim 1, wherein the component B is component B2 which is an N-oxide compound containing a nitrogen-containing heteroaromatic ring skeleton in which at least one hydrogen atom is substituted with a thiol group, or a salt of the N-oxide compound.

5. The polishing liquid composition according to claim 4, wherein the component B2 is at least one selected from an N-oxide compound having a pyridine ring in which at least one hydrogen atom is substituted with a thiol group, an N-oxide compound having a quinoline ring in which at least one hydrogen atom is substituted with a thiol group, or salts of these N-oxide compounds.

6. The polishing liquid composition according to claim 1, wherein the component B is component B3 which is a compound containing a nitrogen-containing heteroaromatic ring skeleton having at least one hydroxyl group and at least one carbonyl group, or a salt of the compound.

7. The polishing liquid composition according to claim 6, wherein the component B3 is at least one selected from a compound in which a hydroxyl group is a substituent of a nitrogen atom of a pyridine ring, a compound in which a hydroxyl group is a substituent of a nitrogen atom of a quinoline ring, or salts of these compounds.

8. The polishing liquid composition according to claim 6, wherein the component B3 is a compound represented by the following formula (I) or a salt of the compound:

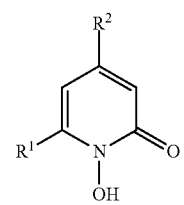

where $R^1$ represents a hydrogen atom or a hydrocarbon group having 1 to 10 carbon atoms and $R^2$ represents a hydrocarbon group having 1 to 6 carbon atoms.

9. The polishing liquid composition according to claim 8, wherein in the formula (I), $R^1$ represents a cyclic or branched hydrocarbon group having 3 to 10 carbon atoms and $R^2$ represents a methyl group.

10. The polishing liquid composition according to claim 6, wherein the component B3 is at least one selected from ciclopirox, piroctone, or salts thereof.

11. The polishing liquid composition according to claim 1, wherein a content of the component A is 0.001% by mass or more and 6% by mass or less.

12. The polishing liquid composition according to claim 1, wherein a mass ratio A/B of the component A to the component B is 0.001 or more and 6000 or less.

13. The polishing liquid composition according to claim 1, having a pH of 3.5 or more and 9 or less.

14. A method for producing a semiconductor substrate, comprising:
    polishing a film to be polished with the polishing liquid composition according to claim 1.

15. A polishing method comprising:
    polishing a film to be polished with the polishing liquid composition according to claim 1.

16. A polishing liquid composition for a silicon oxide film comprising:
    cerium oxide particles as component A;
    an additive as component B; and
    an aqueous medium,
    wherein the component B is at least one selected from a component B1, a component B2, or a component B3:
        the component B1 is a 2-hydroxypyridine N-oxide; the component B2 is an N-oxide compound containing a nitrogen-containing heteroaromatic ring skeleton in which at least one hydrogen atom is substituted with a thiol group, or a salt of the N-oxide compound; and the component B3 is a compound containing a nitrogen-containing heteroaromatic ring skeleton having at least one hydroxyl group and at least one carbonyl group, or a salt of the compound,
    the component B is a reducing compound containing a heteroaromatic ring skeleton, and
    a content of the component B is 0.001% by mass or more and 0.1% by mass or less.

* * * * *